United States Patent [19]

Kruger et al.

[11] 3,872,356

[45] Mar. 18, 1975

[54] THIN FILM ELECTRONIC CIRCUIT UNIT AND METHOD OF MAKING THE SAME

[75] Inventors: Gunter Kruger, Leonberg; Helmut Baum, Stuttgart; Manfred Widmaier, Leonberg-Eltingen, all of Germany

[73] Assignee: Robert Bosch, GmbH, Stuttgart, Germany

[22] Filed: Oct. 30, 1972

[21] Appl. No.: 302,150

[30] Foreign Application Priority Data

Nov. 5, 1971 Germany .......................... 2155029

[52] U.S. Cl. ............ 317/101 A, 117/212, 117/217, 317/101 CC

[51] Int. Cl. ............................................ H05k 1/04

[58] Field of Search ...... 317/101 A, 101 CC, 234 S, 317/234 M; 117/212, 217; 29/195 S, 589, 590; 307/298, 195

[56] References Cited

UNITED STATES PATENTS

| | | | |
|---|---|---|---|
| 3,256,588 | 6/1966 | Sikyna et al. | 317/234 M |
| 3,487,522 | 1/1970 | Harendza-Harinxma | 317/234 S |
| 3,622,385 | 11/1971 | Stork | 317/234 M |

*Primary Examiner*—David Smith, Jr.
*Attorney, Agent, or Firm*—Flynn & Frishauf

[57] ABSTRACT

An insulating substrate is first coated with a film of tantalum. Then either a layer of copper or two layers of copper separated by a diffusion barrier layer of iron, nickel or cobalt are applied by sputtering to metallize the surface. With a photolithographic mask, the copper and tantalum are etched to bare the substrate. Then with a screen printed mask, the copper is selectively etched over resistor and capacitor regions, and the tantalum there is partially oxidized, the copper conductors and contact areas being protected. Solder is then applied to the copper, but does not stick to the oxide.

4 Claims, 9 Drawing Figures

THIN FILM ELECTRONIC CIRCUIT UNIT AND METHOD OF MAKING THE SAME

Figure 1:
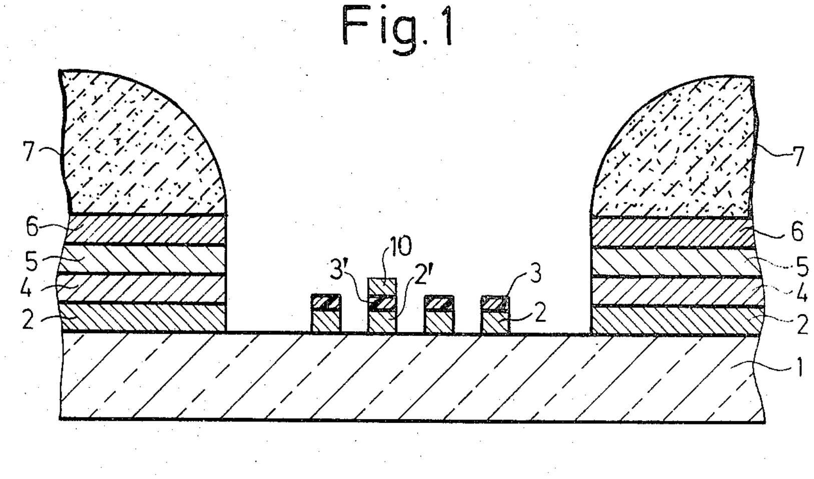

This invention relates to thin film electronic circuit units and thin film laminated material and methods for making such circuit units. In particular the invention concerns electronic circuits on insulating substrates in the form of small carrier plates on which passive electric circuit components are formed in the form of thin layers, such components being connected by flat strip conducting paths, portions of which are provided with contact surfaces for connection to external circuits or for mounting additional circuit components. In these units there is a layer of a valve metal, such as tantalum, directly on the insulating substrate in a pattern corresponding to the passive circuit components and the interconnecting circuit paths, and this layer or film is covered, in the portion of the pattern which corresponds to the circuit paths, including the contact areas, by a metallizing layer or film.

Thin film circuit unit structures of the type above-described are known in which the metallizing applied to the valve metal layer consists of a vapor deposited layer of chromium with a vapor deposited gold layer on top of it. These thin film circuit units are expensive, however, because of the use of gold as contact metal. Besides, the gold interferes with the anodic oxidation of the valve metal layer which is necessary for the adjustment of the resistance value of the latter, because no short circuit healing oxide is formed by interaction of the gold layer and the electrolyte used in anodic oxidation.

The object of the invention is to overcome the disadvantages of the above-described thin film electronic circuit structures. The metallic layers applied are of a thickness between about one and several thousanths Angstrom units. They may consequently be referred to as "films" as well as "layers".

SUBJECT MATTER OF THE PRESENT INVENTION

Briefly, a sputtered film of copper, a film of a diffusion barrier metal such as iron, nickel or cobalt, and a second film of copper are applied in succession over the film of valve metal on the insulating substrate. The use of copper as a metallizing film has the advantage that in the manufacture of thin film circuit units the copper used is an overall coating that lends itself well to full removal from the boundary surface where valve metal and metallizing meet when a selective etching is carried out to remove the copper without removing the valve metal. In consequence no interference of the following anodic oxidation step is produced by leftover copper at the valve metal/metallizing boundary.

To increase the electric conductivity, a solder layer or film is applied on top of the copper which at the contact barriers for external contacts can at the same time serve as a preparatory conditioning surface for the subsequent soldering process. A low-melting soft solder, such as eutectic lead-tin solder, cannot be used successfully with a single layer of copper between it and the valve metal, but when the three-layer system above described is interposed, such as low-melting lead-tin solder layer can be applied with particular advantage.

The invention further involves a method manufacturing the thin film electronic circuit units described. The substrate plates are first covered by an overall film of valve metal and thereon either a three-layer metallizing film, likewise on one entire surface of the substrate. Then by means of a photolythographic process, the basic pattern of the circuit network is etched out of the metal layers, etching both the metallizing films and the valve metal film beneath. Thereafter all places where conducting paths or connection contacts are to be provided are covered by a mask and by means of a selective etching solution the metallizing material is removed from the places where resistances and/or capacitors are to be provided, after which the valve metal thus exposed is anodically oxidized in part to provide the desired cross-sectional thickness of metal and of oxide.

The invention is particularly characterized by the use of cathodic sputtering to provide metallizing of the valve metal film.

It is convenient to provide the second masking step by a screen printing process and to use this mask not only for the selective etching but also for the trimming of the components by anodic oxidation. In connection with the selective etching of the metallizing films, it can be of advantage to heat the structure coated with the screen printed mask to a temperature of 130° C. By such heating, the material of the screen printed mask fuses and begins to flow and spreads over the etched edges down onto the upper surface of the carrier substrate or, as the case may be, onto the exposed valve metal layer. In this manner an excellent protection of the etched edges is provided against attack by the electrolyte used in anodic oxidation.

The invention will be described by way of example with reference to the accompanying drawings, wherein:

FIG. 1 is a cross-section of a thin film electronic circuit containing a resistor network, and FIGS. 2*a* through 2*h* are cross-sections of a thin film electronic circuit of FIG. 1 at successive stages of the process of manufacture according to this invention.

As shown in FIG. 1, when a carrier plate 1 is constituted of a suitable insulating substrate, a valve metal layer 2 of a thickness of 1000 A is provided in a circuit defining pattern, the presence of which is indicated by the interruptions of the layer 2 shown in FIG. 1. The term "valve metal" means a metal that forms a direct current blocking oxide. Tantalum is preferably used as the valve metal. Instead of tantalum, however, niobium, aluminum, zirconium and hafnium can be used.

The valve metal film 2 carries on those portions of its surface, which do not belong to resistors of the circuit, a three-layer metallizing film composed of the three layers 4, 5 and 6. The lowest of these layers (4) and the uppermost (6) of this metallizing film are each copper films of a thickness of 2000 A.

The intermediate layer 5 between the copper layers 4 and 6 is a film of a metal that acts as a diffusion barrier, for example iron, nickel or cobalt. The thickness of this barrier forming layer 5 measures about 4000 A. The metallizing layer constituted by films 4, 5 and 6 is applied at all those parts of the valve metal film 2 which form conducting paths and those which form contact areas for external connections.

On top of the metallizing layer composed of films 4, 5 and 6 is a solder coating 7 of lead-tin eutectic. In this case, the intermediate layer 5 acts as a diffusion barrier to prevent excessive diffusion of material from the solder layer 7 into the lower copper layer 4. The solder layer 7, together with the layers 4, 5 and 6 of the underlying portion of the valve metal layer 2, forms both the conducting paths and the solder accepting contacts which may serve for providing external connections to the thin film circuit unit and/or for mounting additional circuit elements. When additional circuit elements are mounted on a thin film circuit unit, the resulting device is commonly referred to as a thin film hybrid device or unit. The oxide portion of the valve metal film 2, which are not covered by the layers 4,5,6 and 7, form the resistor network of the thin film circuit unit or thin film hybrid circuit unit, as the case may be.

Figure 2A:
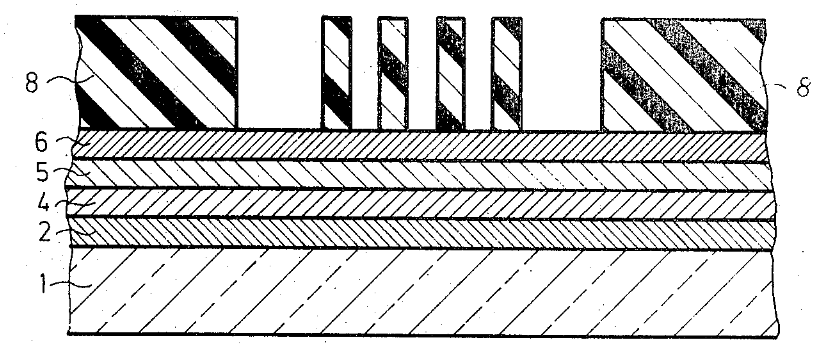
Figure 2B:
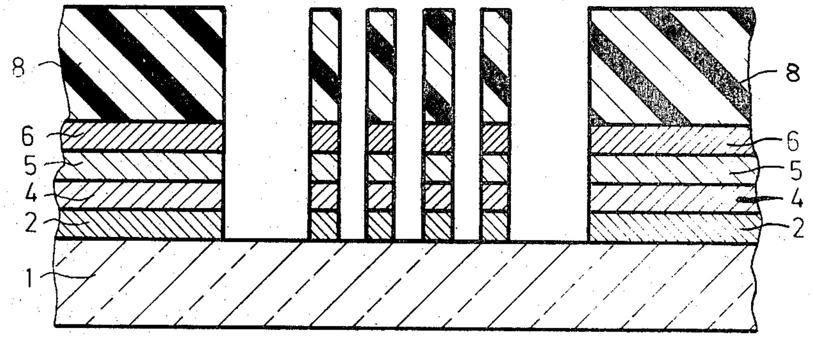
Figure 2C:
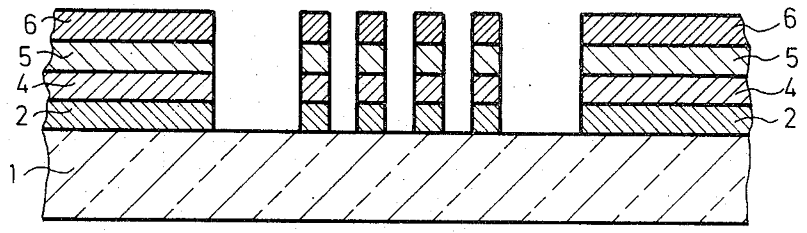
Figure 2D:
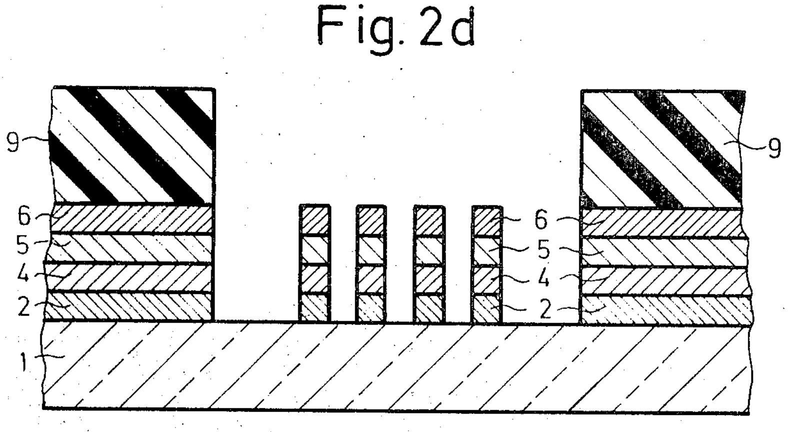

FIGS. 2*a* through 2*h* show the thin film circuit unit at the various stages of the process of manufacture according to the invention. A continuous film of valve metal is first applied to the carrier substrate 1. On top of film 2, the metallic films 4,5 and 6 are successively applied by cathodic sputtering. On the coated carrier substrate a photoresist mask is applied as shown in FIG. 2*a* in accordance with known methods, which protects and covers portions of the layer system 2,4,5,6 that is necessary to preserve for the completed structure of the thin film circuit unit. These are all the areas which will constitute the resistance paths, the conduction paths or the connection contact surfaces, in other words, those regions which together form the basic pattern of the thin film electronic circuit configuration. The openings of the mask 8 are accordingly those regions in which the surface of the substrate carrier itself should be exposed. The substrate carrier coated with the layers 2,4,5 and 6 and with the photoresist mask 8 is accordingly dipped in a mixture of hydrofluoric acid, nitric acid and water and the basic pattern of the circuit unit is thereby etched out, as shown in FIG. 2*b*. The carrier substrate and the circuit pattern now carried on it are then dipped in acetone and the photoresist mask 8 is thereby dissolved away, as shown in FIG. 2*c*. Thereafter the portions of the layer system 2,4,5,6 which are to provide conduction paths or contact surfaces, but not the remainder of the pattern of this layer system, are covered with a finishing mask 9 applied by means of a screen printing process. The locations in which resistors are to be provided are not covered by the mask 9.

Figure 2E:
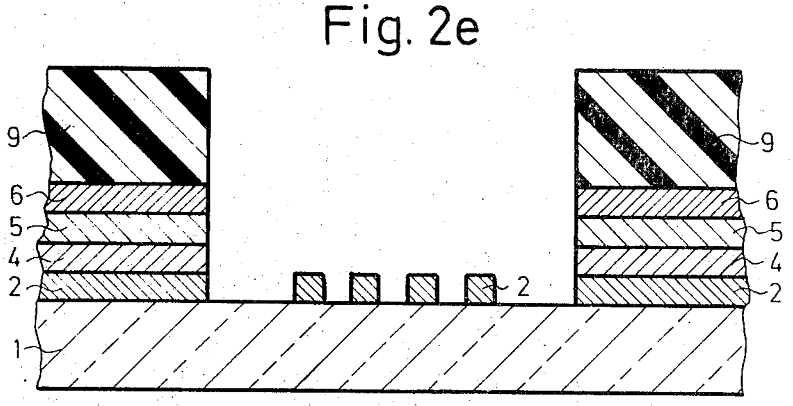
Figure 2F:
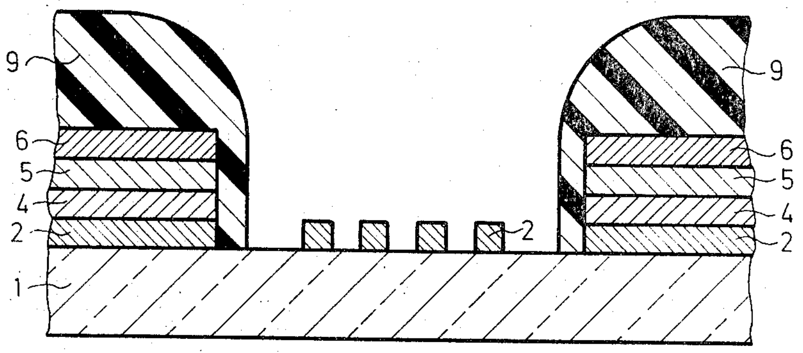
Figure 2G:
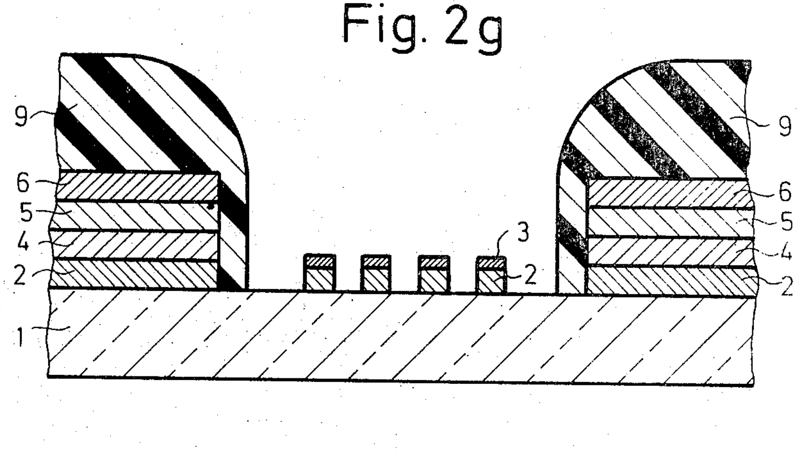

The carrier substrate has its patterned film system 2,4,5,6 partly covered by finishing mask 9 and is then dipped in dilute nitric acid, causing the metallizing material consisting of layers 4,5 and 6 at the places not covered by finishing mask 9 to be selectively etched away. In these positions, therefore, as shown in FIG. 2*e*, there remains the valve metal layer 2, which is not subject to attack by this etchant. Thereafter, the unit with its patterned system 1,2,4,5,6 partly covered by finishing mask 9 and selectively etched at the exposed locations, is heated to a temperature of 130° C. In consequence, the masking material, which is typically picein resin, fuses and flows enough to spread down over the etched edges onto the exposed surface of the substrate or, as the case may be, onto the valve metal layer. FIG. 2*f* shows carrier substrate 1 with the layer system 2,4,5,6 and the screen printed mask 9 after heating to 130° C. The spill-over of the mask is clearly indicated there.

Next, the surfaces of the valve metal film exposed by etching away the overlying layers are partly converted into an oxide layer 3 by anodic oxidation in order to increase the ohmic resistance of these portions of the film to a prescribed value. During this treatment the screen printed mask 9, which has been caused to droop over the etched edges of the metallizing layers 4,5 and 6 and even over the etched edges of the underlying valve metal layer 2, provides excellent protection of the conductor paths and of the contact locations against attack by the electrolyte. If, nevertheless, on account of a defect in the screen printed mask a conducting path or a contact surface should be exposed at any place, a short circuit curing oxide will be produced when the electrolyte should come in contact with the metallizing layers:

$$Cu^{++} + 2\,OH^- \rightarrow CuO + H_2O$$

$$Fe^{++} + 2\,OH^- \rightarrow FeO + H_2O$$

Following anodic oxidation, the screen printed mask 9 is removed by dipping the structure 1,2,3,4,5,6,9 in trichlorethylene. The resulting structure 1,2,3,4,5,6, shown in FIG. 2*h*, forms a thin film circuit unit with a resistor network consisting of valve metal and with connecting conduction paths and contact surfaces consisting of underlying valve metal and a three-layer metallizing formation firmly deposited thereon. The metallizing layer may be formed by a iron-copper system, a copper and nickel copper system or a copper-cobalt system.

Figure 2H:
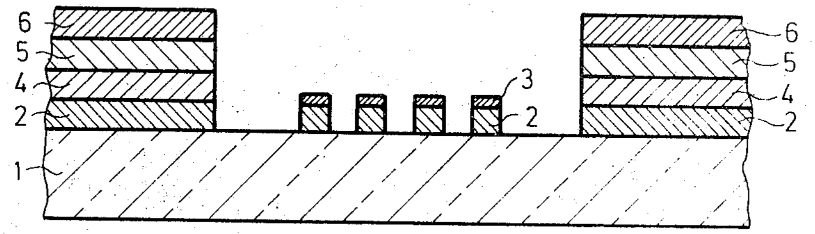

The structure 1,2,3,4,5,6, illustrated in FIG. 2*h*, is then dipped in a solder consisting of lead-tin eutectic. The liquid solder does not wet or coat the resistor paths, which are covered with the oxide layer 3. The upper surface of the metallizing material 4,5,6, on the other hand, is wetted by the liquid solder so that a solder layer 7 is formed, resulting in the structure illustrated in FIG. 1 that represents a completed thin film electronic circuit unit. The advantage of the metallization consisting of layers 4,5 and 6 resides in the property of the intermediate layer 5 composed of iron, nickel or cobalt that enables the layer to provide a barrier against unduly rapid diffusion components of the solder 7 into the lower copper layer 4.

The addition of solder layer 7 to the conducting paths considerably increases their electric conductivity.

The oxidized portions of the valve metal layer 2 may serve to provide capacitors in an electric circuit unit as well as resistors. Tantalum oxide, for example, provides an excellent capacitor dielectric. Thus, the portion 2′ of the tantalum layer 2 in FIG. 1 is shown covered not only by the oxide layer 3′ but by an additional conducting layer 10 to form a capacitor. The conducting layer 10 may be applied by another masking step followed by sputtering or vapor deposition of a suitable metal, but if the contact surface cannot be provided immediately above the capacitor dielectric, the metal layer may be prolonged over a portion of the bare insulating substrate 1 to a place where it may make contact to an unmasked portion of the layer structure 4,5,6 which will provide a conducting path to a suitable contact surface.

We claim:

1. A thin film electronic circuit unit of laminate structure comprising:

a substrate of insulating material;

a film of valve metal on said substrate partially covering said substrate in a first and a second pattern, said first and second patterns being electrically connected by at least one local contiguity and respectively defining a first and a second portion of said film, said first pattern defining circuit elements and said second pattern defining both contactable areas of a circuit and also circuit connections;

a film of valve metal oxide on said first portion of said film of valve metal, said first portion of said film of valve metal being of a thickness reduced relative to said second portion of said film of valve metal by the presence of said oxide film;

a first film of copper on said second portion of said film of valve metal;

a film of diffusion barrier metal on said first film of copper;

a second film of copper above said film of diffusion barrier metal, and a coating of low-melting lead-tin solder on the outermost film of copper.

2. A thin film electronic circuit unit as defined in claim 1 in which said diffusion barrier metal is iron.

3. A thin film electronic circuit unit as defined in claim 1 in which said diffusion barrier metal is nickel.

4. A thin film electronic circuit unit as defined in claim 1 in which said diffusion barrier metal is cobalt.

* * * * *